(12) United States Patent
Walker (10) Patent No.: US 8,521,958 B2
(45) Date of Patent: Aug. 27, 2013

(54) INTERNAL PROCESSOR BUFFER

(75) Inventor: Robert Walker, Raleigh, NC (US)

(73) Assignee: Micron Technology, Inc., Boise, ID (US)

( * ) Notice: Subject to any disclaimer, the term of this patent is extended or adjusted under 35 U.S.C. 154(b) by 435 days.

(21) Appl. No.: 12/478,457

(22) Filed: Jun. 4, 2009

(65) Prior Publication Data

US 2010/0312999 A1 Dec. 9, 2010

(51) Int. Cl.
*G06F 13/28* (2006.01)

(52) U.S. Cl.
USPC ....... 711/119; 711/122; 711/124; 365/189.05

(58) Field of Classification Search
USPC ..................... 711/119, 122, 124; 365/189.05
See application file for complete search history.

(56) References Cited

U.S. PATENT DOCUMENTS

| | | | | |
|---|---|---|---|---|
| 5,895,487 | A * | 4/1999 | Boyd et al. ..................... | 711/122 |
| 6,175,937 | B1 * | 1/2001 | Norman et al. ................ | 714/718 |
| 6,959,316 | B2 * | 10/2005 | Parviainen ..................... | 708/620 |
| 2005/0024983 | A1 * | 2/2005 | Kirsch ........................... | 365/232 |

OTHER PUBLICATIONS

U.S. Appl. No. 12/478,465, filed Jun. 4, 2009, Walker.
U.S. Appl. No. 12/478,412, filed Jun. 4, 2009, Walker.
U.S. Appl. No. 12/478,527, filed Jun. 4, 2009, Walker.
U.S. Appl. No. 12/478,532, filed Jun. 4, 2009, Walker.
U.S. Appl. No. 12/478,450, filed Jun. 4, 2009, Walker.
U.S. Appl. No. 12/603,376, filed Oct. 21, 2009, Walker et al.
U.S. Appl. No. 12/603,393, filed Oct. 21, 2009, Walker et al.
Jay B. Brockman, et al.; Microsavers: A New Memory Semantics for Massively Parallel Computing; Proceedings of the 13th International Conference on Supercomputing; 1999, pp. 454-463.
Krishna Kumar Rangan, et al.; A Distributed Multiple-SIMD Processor in Memory; Parallel Processing, International Conference on 2001, Sep. 3-7, 2001; Piscataway, NJ, USA.
Jeff Draper, et al.; Implementation of a 256-bit Wide Processor for the Data-Intensive Architecture of the (DIVA) Processing-In-Memory (PIM) Chip; Solid-State Circuits Conference, pp. 77-80, Sep. 2002; Piscataway, NJ, USA.

* cited by examiner

*Primary Examiner* — Pho M Luu
*Assistant Examiner* — Thao Bui
(74) *Attorney, Agent, or Firm* — Fletcher Yoder (57) ABSTRACT

One or more of the present techniques provide a compute engine buffer configured to maneuver data and increase the efficiency of a compute engine. One such compute engine buffer is connected to a compute engine which performs operations on operands retrieved from the buffer, and stores results of the operations to the buffer. Such a compute engine buffer includes a compute buffer having storage units which may be electrically connected or isolated, based on the size of the operands to be stored and the configuration of the compute engine. The compute engine buffer further includes a data buffer, which may be a simple buffer. Operands may be copied to the data buffer before being copied to the compute buffer, which may save additional clock cycles for the compute engine, further increasing the compute engine efficiency.

29 Claims, 10 Drawing Sheets

INTERNAL PROCESSOR BUFFER

BACKGROUND

1. Field of Invention

Embodiments of the invention relate generally to systems, and more particularly, to systems with one or more internal processors, such as arithmetic logic units.

2. Description of Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light and not as admissions of prior art.

Electronic systems typically include one or more processors, which may retrieve and execute instructions, and output the results of the executed instruction, such as to store the results to a suitable location. A processor generally includes arithmetic logic unit (ALU) circuitry, which is capable of executing instructions such as arithmetic and logic operations on one or more operands. For example, the ALU circuitry may add, subtract, multiply, or divide one operand from another, or may subject one or more operands to logic operations, such as AND, OR, XOR, and NOT logic functions. The various arithmetic and logic operations may have different degrees of complexity. For example, some operations may be executed by inputting the operand(s) through the ALU circuitry in one cycle, while other operations may utilize multiple clock cycles.

A number of components in the electronic system may be involved in directing a set of instructions to the ALU for execution. For example, the instructions and any corresponding data (e.g., the operands on which the operations will be executed) may be generated by a controller, or some other suitable processor in the electronic system. As the time or number of clock cycles required for the execution of a set of instructions may vary depending on the type of operation, the instructions and data may be written to a memory device, for example, a memory array and/or buffer, before the ALU receives and executes the instructions. After the ALU executes the instructions, the intermediate or final results of the operations may also be stored in a buffer before being copied back to an array. The steps of writing, reading, buffering, executing instructions, and storing results may occur substantially simultaneously on different instructions, or different parts of an instruction. This parallel processing, referred to as "pipelining," may improve processing performance in the electronic system.

BRIEF DESCRIPTION OF DRAWINGS

Certain embodiments are described in the following detailed description and in reference to the drawings in which.

DETAILED DESCRIPTION

Arithmetic logic unit (ALU) circuitry is generally used to process instructions in multiple stages. Processing the instructions may include executing the instructions, and storing the results of the executed instructions. More specifically, instructions, and the data on which the instructions will be executed, may be sent by a controller to the ALU, and may first be stored in a memory device to be retrieved when the ALU circuitry is available to execute the instructions. Once the instructions have been executed, the ALU may write the results of the operation to a memory component, or to any other suitable output.

In some memory systems, the memory array may be external to the ALU. Thus, an external bus may input the instructions and data from a memory array to an ALU, and output the completed results back to the memory array or other suitable output. Such external input/outputs may increase power consumption in the system. In one or more embodiments of the present techniques, one or more processors, such as one or more ALUs, may be packaged with or embedded on a memory device. Such processors are hereinafter referred to as "internal processors." For example, the memory device may be a processor-in-memory (PIM), and may include embedded ALUs and a memory array, which may store instructions and data to be processed by the ALUs and the results from the completed instructions. In other embodiments, the ALUs and the memory array may be on unique dies in the same package. For example, the ALUs and the memory array may be arranged in a multi-chip package (MCP), and may be electrically connected by a through-silicon via (TSV). Such internal processors may eliminate the need for an external bus to transfer information between the memory array and the ALU, conserving power in the electronic device.

One embodiment of the present techniques involves a memory device having an embedded compute engine including one or more ALUs. The memory device may include a memory array, which may store instructions to be performed by the ALUs, the data to which the instructions are directed, and results from the instructions completed by the ALUs. Further, a sequencer and buffer may also be integrated on the memory device to configure (e.g., sequence) and hold the instructions and/or data before the ALU performs the operations.

One or more of the present techniques disclose systems and methods of transferring (e.g., reading and/or writing) data to and from a buffer on a memory device to increase the efficiency of, for example, a compute engine embedded on the memory device. As discussed, the system may process more efficiently when the steps to data processing are performed in parallel. The retrieval of instructions and data, execution of instructions on the data, and recording of the results may all occur substantially simultaneously. Further, in the retrieval process, information (e.g., instructions and/or data) may also be written from the memory array to the buffer, and the ALU may retrieve the information from the buffer. The buffer may also be used to hold intermediate results of the executed instructions, as well as final results before they are written to the memory array. The parallel transfer of information between the memory array, the buffer, and the ALU may also increase the efficiency of data processing. In one or more embodiments of the present techniques, a buffer may be configured to store operands such that an ALU in a compute engine may process all the bytes of an operand without adding latency to shift the operands into position. Furthermore, the buffer may be configured to store operands such that multiple operands may be processed in parallel by the multiple ALUs in the compute engine to improve processing performance.

Several of the terms used above may be used throughout the present disclosure, and definitions of such terms are provided to facilitate a better understanding of the present techniques. A "memory device" may include memory, such as dynamic random access memory (DRAM) or synchronous dynamic random access memory (SDRAM) embedded on an integrated circuit chip or board. One or more ALUs, or any other circuitry suitable for performing instructions in an electronic system, each of which being referred to herein as a "processor," may also be embedded on the memory device. A "controller" may refer to a processor which may be external to the memory device and configured to direct instructions and/or data to the sequencer or the ALUs in the memory device, or to the memory array or buffer to be retrieved by the ALUs. The controller may direct (e.g., send) "instructions" (e.g., operations) which refer to the task to be executed by the internal processor (e.g., ALUs). For example, instructions may include arithmetic or logic operations, or any other task which a processor (e.g., ALU) may be suitable for performing. Instructions may sometimes require more than one "cycle," or more than one pass through one or more ALUs, before the complete instruction has been executed. "Operands" may refer to the data on which operations are executed, and depending on the instruction, one or more operands may be input into the ALU circuitry at the same time. Additionally, in some operations, an operand may be input through an ALU in one cycle, and carried out of the ALU and back into the same or another ALU as an operand for an additional cycle(s).

Figure 1:
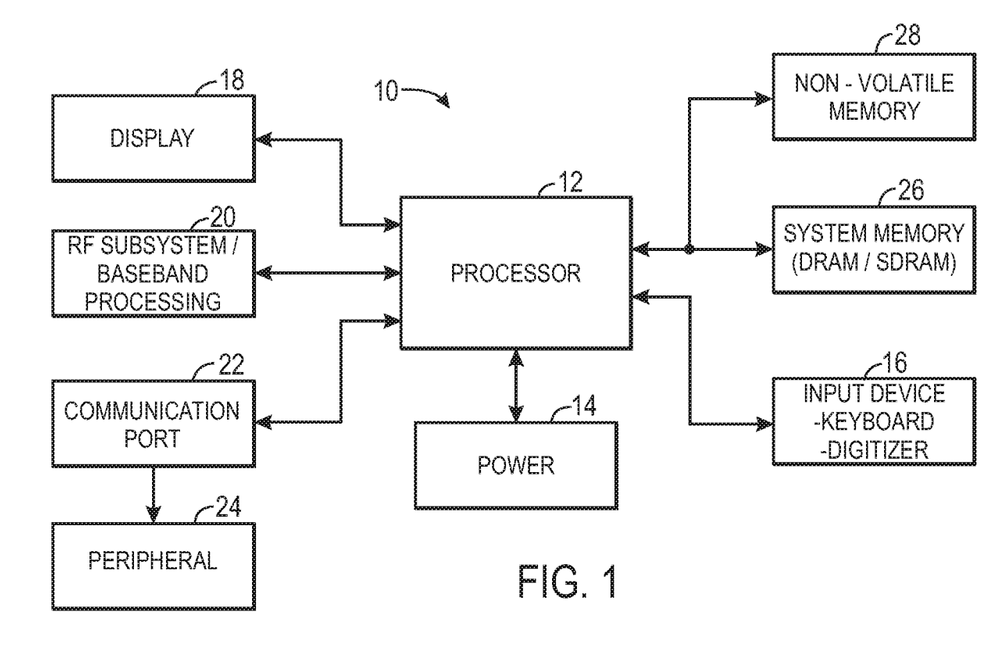
FIG. 1 depicts a block diagram of a processor-based system in accordance with an embodiment of the present technique.

Now turning to the figures, FIG. 1 depicts a processor-based system, generally designated by reference numeral 10. As is explained below, the system 10 may include various electronic devices manufactured in accordance with embodiments of the present technique. The system 10 may be any of a variety of types such as a computer, pager, cellular phone, personal organizer, control circuit, etc. In a typical processor-based system, one or more processors 12, such as a microprocessor, control the processing of system functions and requests in the system 10. As is explained below, the processor 12 and other subcomponents of the system 10 may include memory devices manufactured in accordance with one or more embodiments of the present technique.

The system 10 typically includes a power supply 14. For instance, if the system 10 is a portable system, the power supply 14 may advantageously include a fuel cell, a power scavenging device, permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, an input device 16 may be coupled to the processor 12. The input device 16 may include buttons, switches, a keyboard, a light pen, a mouse, a digitizer and stylus, and/or a voice recognition system, for instance. A display 18 may also be coupled to the processor 12. The input device 16 and/or the display 18 may each or both form a user interface. The display 18 may include an LCD, an SED display, a CRT display, a DLP display, a plasma display, an OLED display, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by executing instructions stored in the memory to implement software programs. The software programs may include an operating system, database software, drafting software, word processing software, and/or video, photo, or sound editing software, for example. The memory is operably coupled to the processor 12 to store and facilitate execution of various programs. For instance, the processor 12 may be coupled to the system memory 26 which may include dynamic random access memory (DRAM), and/or synchronous dynamic random access memory (SDRAM). In one embodiment, the processor 12 may include a memory controller, as previously discussed, which may be capable of communicating with a memory device in the system memory 26. Also as discussed, a memory device in the system memory 26 may include memory arrays (e.g., a DRAM array or an SDRAM array), as well as embedded computing units, such as ALUs. Further, the system memory 26 may include volatile memory, non-volatile memory, or a combination thereof, and is typically large so that it can store dynamically loaded instructions for applications and data.

The processor 12 may also be coupled to non-volatile memory 28, which is not to suggest that system memory 26 is necessarily volatile. The non-volatile memory 28 may include read-only memory (ROM), such as an EPROM, resistive read-only memory (RROM), and/or flash memory to be used in conjunction with the system memory 26. The size of the ROM is typically selected to be just large enough to store any necessary operating system, application programs, and fixed data. Additionally, the non-volatile memory 28 may include a high capacity memory such as a tape or disk drive memory, such as a hybrid-drive including resistive memory or other types of non-volatile solid-state memory, for instance.

One or more embodiments of the present technique involve the communication between the processor 12 and components of the system memory 26. More specifically, the processor 12 may include a general purpose processor, a central processing unit, a processor core, processor cores, an ASIC, a memory controller, and/or an ALU, for example, capable of sending signals to and receiving signals from internal processors packaged with, such as embedded on memory devices in the system memory 26. Components of the system 10 involved in the communication between the processor 12 and the components of the system memory 26 may be generally referred to as a "memory system" 100, as illustrated in the block diagram of FIG. 2. In some embodiments, a memory system 100 may include a memory device 104, which may be part of the system memory 26 of the system 10 (as in FIG. 1) and may have an internal processor. The memory system 100 may also include an external processor, such as a memory controller 102, which may be in a system-on-a-chip (SOC) with a more general purpose processor to collectively form a processor 12 of a processor-controlled system 10 (as in FIG. 1), for example. The memory controller 102 may communicate with certain components of a memory device 104, such as to control one or more of those components.

Figure 2:
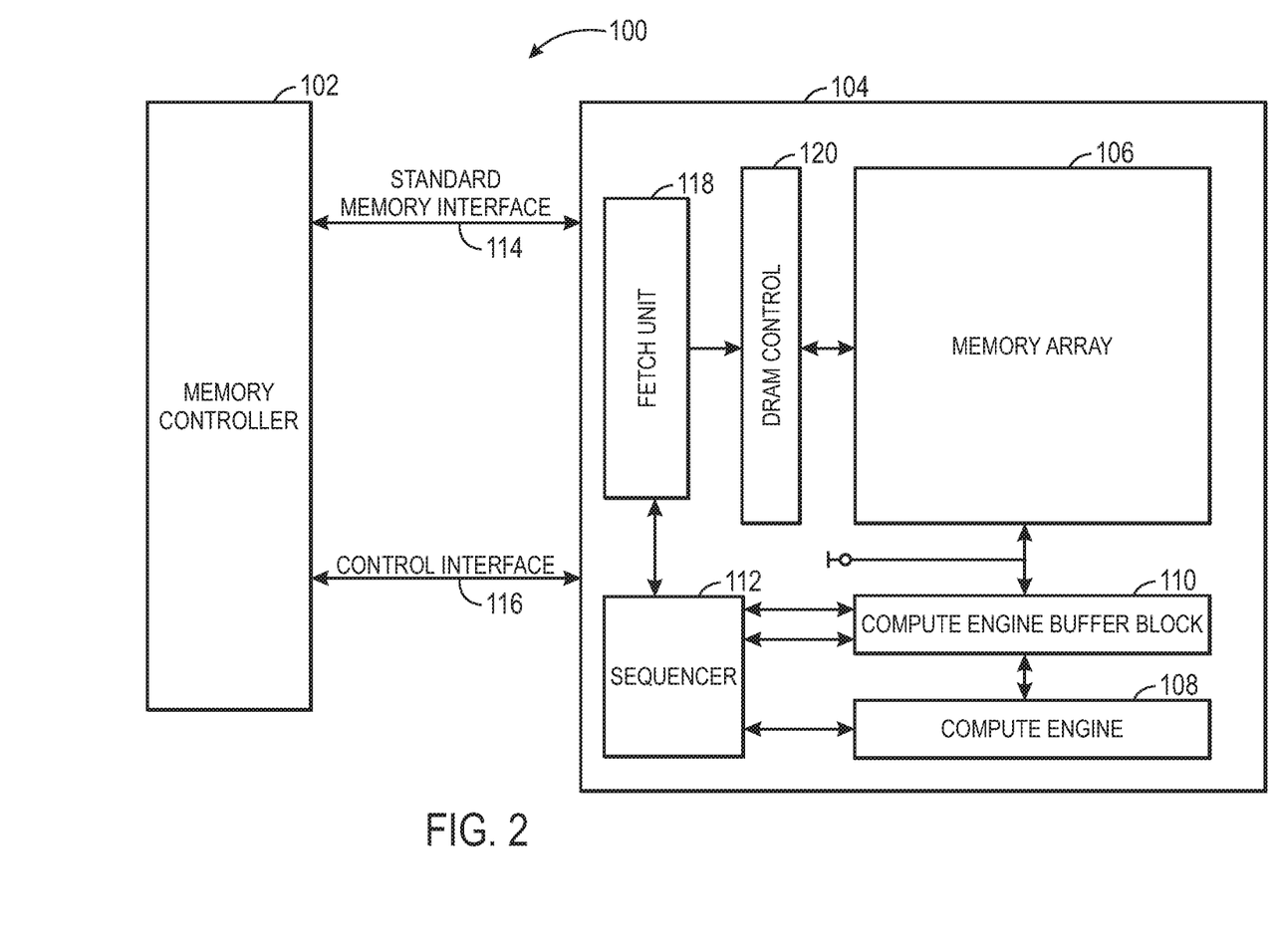
FIG. 2 depicts a block diagram of a memory device with embedded arithmetic logic units (ALUs) interfaced with a memory controller, in accordance with an embodiment of the present technique.

The memory system 100 may include components which have functions that are not limited to the communication between the memory controller 102 and the memory device 104. For example, the memory controller 102 may control devices in addition to the memory device 104. However, the memory controller 102, as explained with respect to the memory system 100, may refer to one function of the memory controller 102 which communicates with certain elements of the memory device 104. Likewise, not all parts of the system memory 26 may be part of the memory system 100. The "memory device" 104 may refer to components of the system memory 26 involved in the communication with the memory controller, in accordance with one or more of the present techniques.

The memory controller 102 and the memory device 104 may be operably coupled by a standard memory interface 114 (e.g., DDR, DDR2, DDR3, LPDDR, or LPDDR2, etc.), which may allow the memory controller 102 to direct information to the memory device 104. In some embodiments, an additional interface(s) may be configured to also allow information transfer from the memory device 104 to the memory controller 102. For example, the memory controller 102 and the memory device 104 may also be operably coupled by a control interface 116, which may allow communication between the memory controller 102 and the memory device 104, including communication from the memory device 104 to the memory controller 102.

The memory device 104 may include a memory array 106 and an internal processor, such as a compute engine 108. The memory array 106 may refer to any suitable form of storage, and may include, for example, a DRAM array or an SDRAM array. The memory controller 102 may have access to the memory array 106, and may be able to send data or instructions to be performed by the compute engine 108. The compute engine 108 may include one or more arithmetic logic units (ALUs), or any other circuitry which may be capable of performing instructions sent from another processor (e.g., the memory controller 102), including, for example, arithmetic operations such as addition, subtraction, multiplication, and division, and logic functions such as AND, OR, XOR, and NOT functions.

The compute engine 108 may be embedded on the memory device 104 and capable of accessing the memory array 106, including retrieving information from, and storing information to the memory array 106. In some embodiments, the compute engine 108 may access information from the memory array via a sequencer 112 and compute engine buffer block 110. The sequencer 112 may configure (e.g., organize, sequence) the instructions sent by the controller 102 to the memory array 106 and store the data retrieved by the memory array 106 in the compute engine buffer block 110. Once the compute engine 108 has executed the instructions, the results may be stored in the compute engine buffer block 110 before they are written to the memory array 106. Further, as some instructions may require more than one clock cycle in the compute engine, intermediate results may also be stored in the compute engine buffer block 110.

Figure 3:
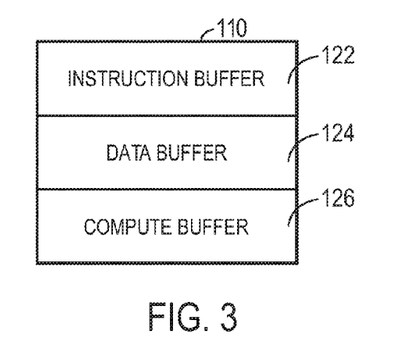
FIG. 3 depicts a block diagram of a compute engine buffer block on the memory device, in accordance with an embodiment of the present technique.

As depicted in FIG. 3, in some embodiments, the compute engine buffer block 110 may include one or more buffers. For example, the buffer block 110 may include an instruction buffer 122, which stores instructions retrieved from the memory array 106 (as in FIG. 2). The sequencer 112 (FIG. 2) may write or read instructions to be sequenced to the instruction buffer 122. The buffer block 110 may also include a compute buffer 126, which stores data to be operated on by the compute engine 108. Further, the compute buffer 126 may store final results or intermediate results of the instructions executed by the compute engine 108. In some embodiments, the buffer block 110 may also include a data buffer 124. As will be discussed, the data buffer 124 may be a simple and denser buffer compared to the instruction buffer 122 and/or the compute buffer 126 to increase the density and storage of the compute buffer 126, further improving parallel processing of the compute engine 108.

Figure 4:
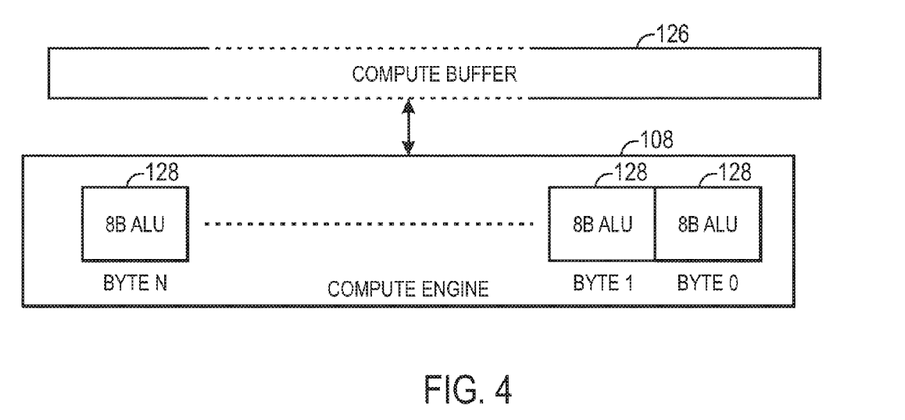
FIG. 4 depicts a block diagram of a compute buffer and a compute engine comprising ALUs embedded on a memory device, in accordance with one or more embodiments of the present technique.
Figure 6:
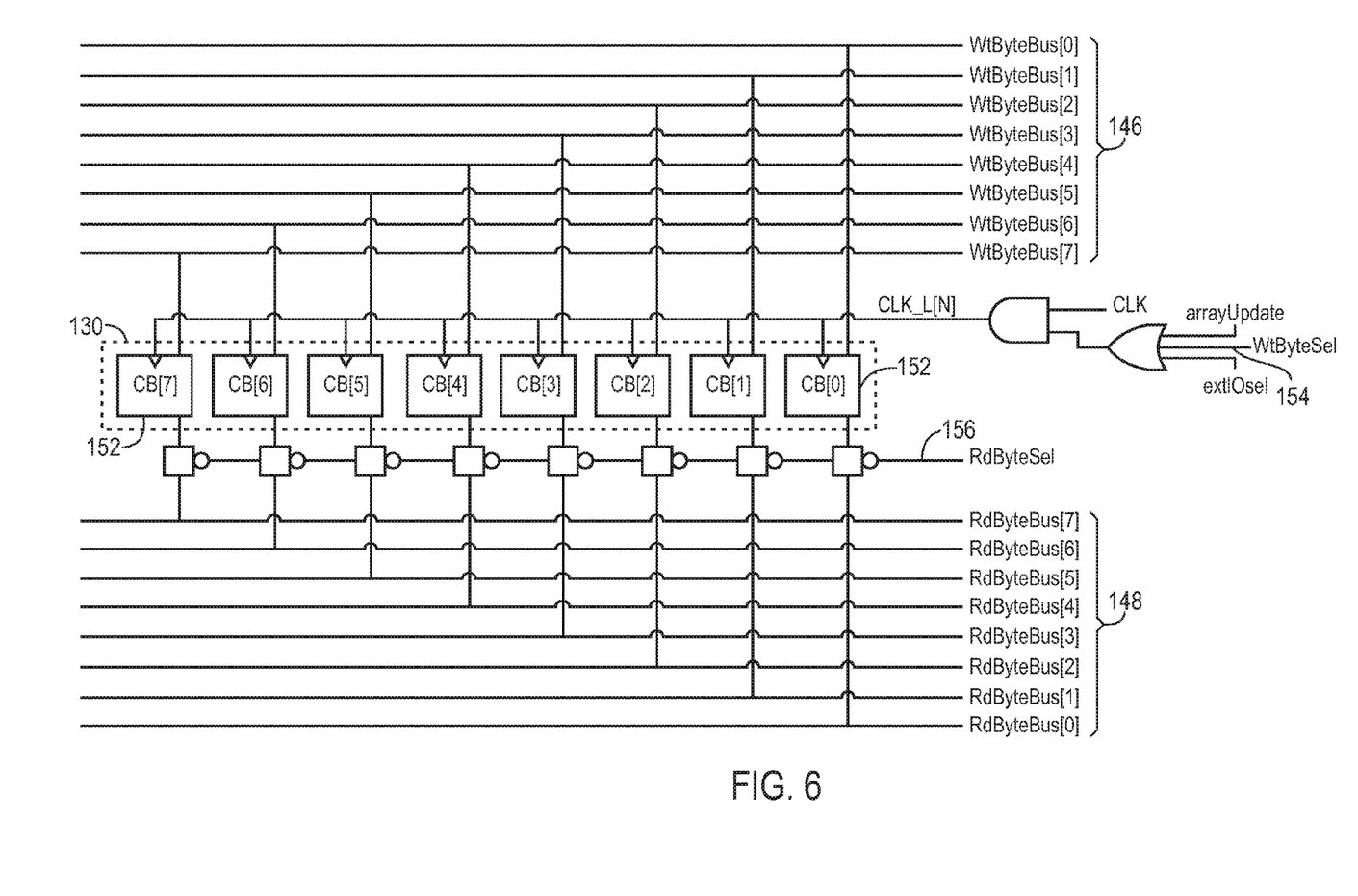
FIG. 6 illustrates the storage units of the compute buffer, in accordance with one or more embodiments of the present technique.
Figure 7:
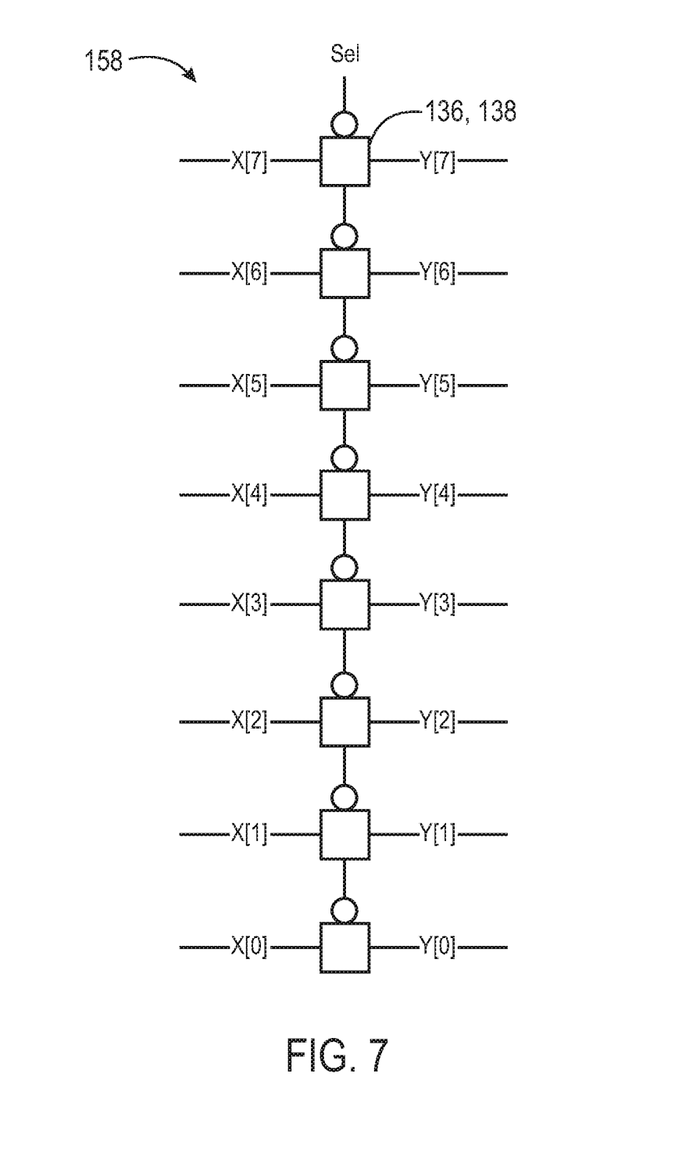
FIG. 7 illustrates the pass gates which isolate or connect the storage units of the compute buffer, in accordance with one or more embodiments of the present technique.
Figure 8:
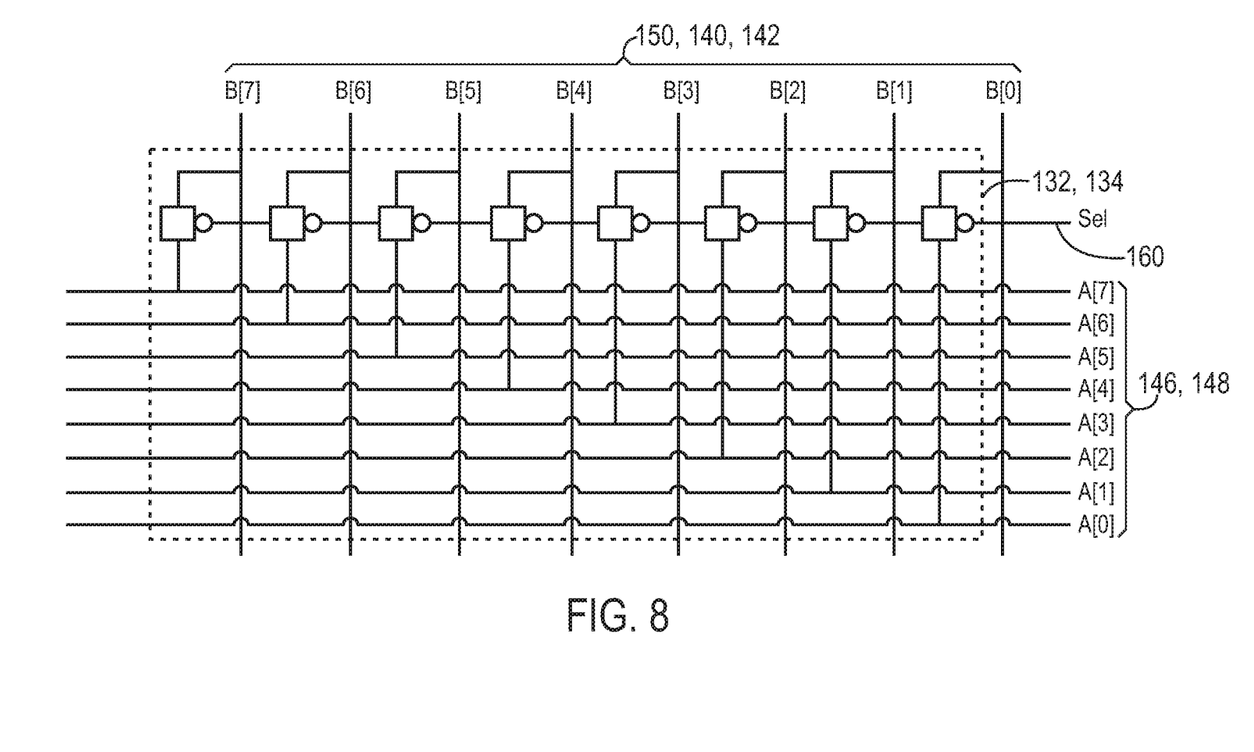
FIG. 8 illustrates the data multiplexer which selects a row in the compute buffer, in accordance with one or more embodiments of the present technique.

As discussed, and as depicted in the block diagram of FIG. 4, the compute engine 108 is composed of one or more ALUs 128, and is interfaced with the compute buffer 126. In the illustrated embodiment, each of the ALUs 128 is an 8 bit (1 byte) ALU. As will be appreciated, other sizes of ALUs may also be employed. In one embodiment, the compute buffer 126 may be configured such that data may be written to and read from storage units in the compute buffer 126, such as to allow reductions in the number of compute cycles of the compute engine 108. One embodiment of the compute buffer 126 in accordance with one or more embodiments of the present techniques is presented in the block diagram of FIG. 5. The CBbyte 130, the pass gates 136 and 138, and the data multiplexers 132 and 134 of the compute buffer 126 are illustrated in greater detail in FIGS. 6-8. Furthermore, FIGS. 9 and 10 explain, respectively, embodiments of a write process 200 and a read process 220 for the compute buffer 126. As FIGS. 6-8 depict components of the compute buffer 126 in FIG. 5, and as the compute buffer 126 in FIG. 5 and the components in FIGS. 6-8 illustrate components which may be involved in the write and read processes 200 and 220 of FIGS. 9 and 10, FIGS. 5-10 may be explained concurrently.

Figure 5:
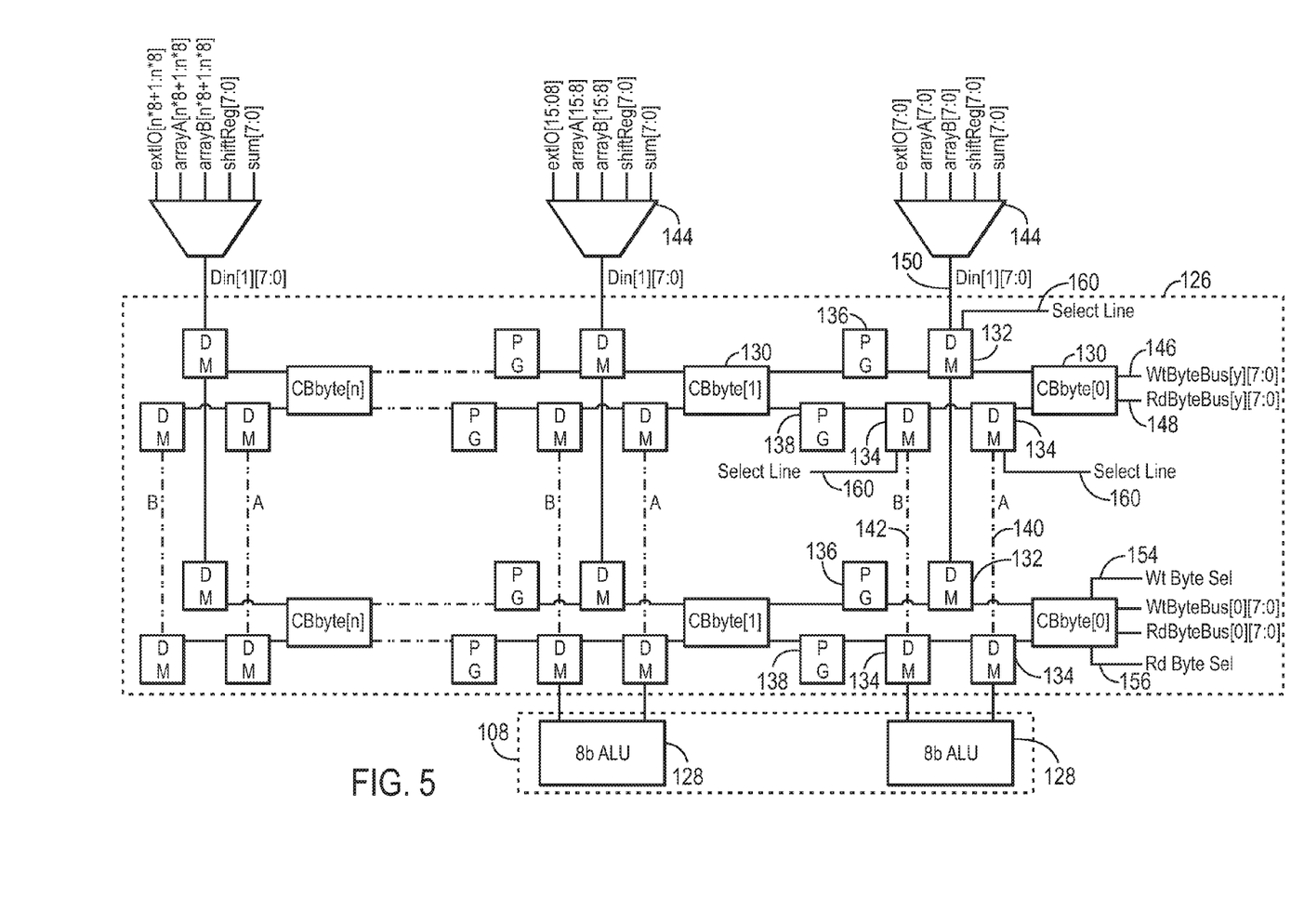
FIG. 5 depicts a block diagram of certain components of a compute buffer, coupled to the ALUs of a compute engine, in accordance with one or more embodiments of the present technique.
Figure 9:
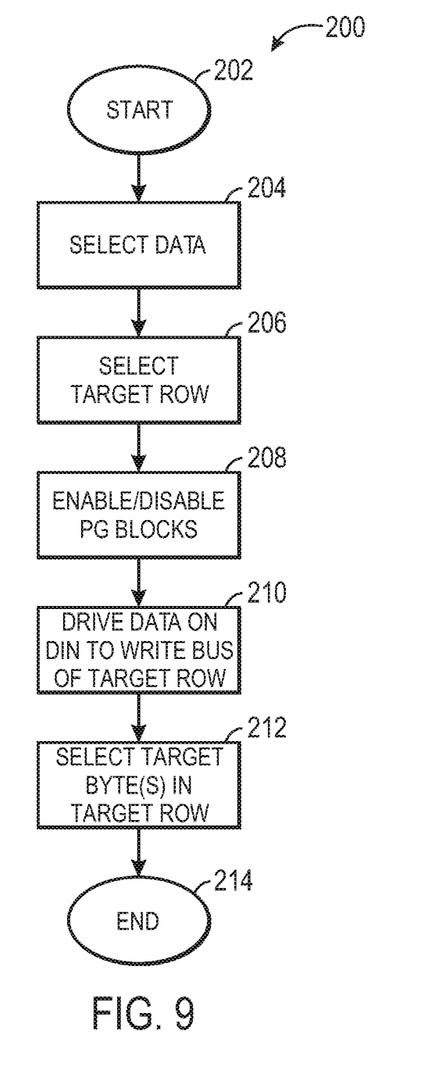
FIG. 9 is a flow chart of a process for writing to a compute buffer, in accordance with one or more embodiments of the present technique.
Figure 10:
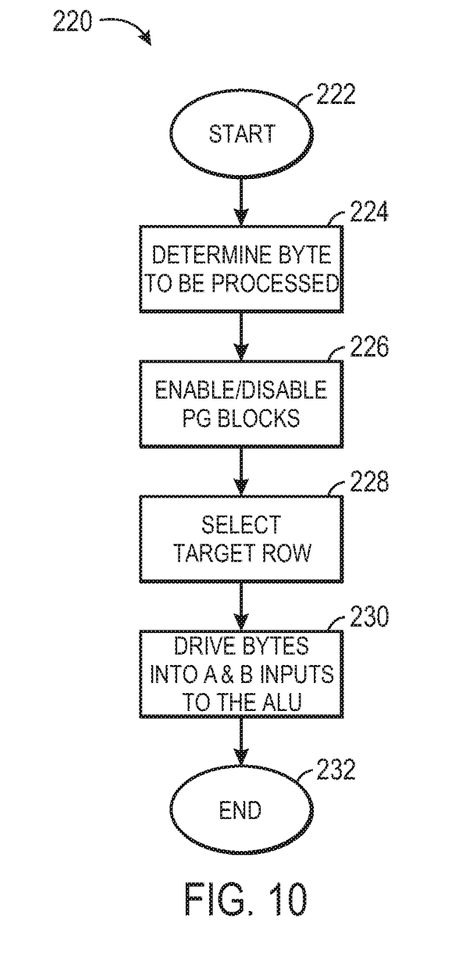
FIG. 10 is a flow chart of a process for reading from a compute buffer, in accordance with one or more embodiments of the present technique.

Further, several components of the compute buffer 126 are labeled in the block diagram of FIG. 5, and the labels will be briefly discussed. The block 130 is illustrated as CBbyte[n:0], and represents the individual storage units of the compute buffer 126. In this embodiment, each storage unit 130 in the compute buffer 126 is 1 byte wide, and thus each storage unit 130 is named "CBbyte" 130. The blocks 136 and 138 labeled "PG" represent pass gates in the compute buffer 126. As will be discussed, the pass gates 136 and 138 may be enabled or disabled to electrically connect or isolate each CBbyte 130 during write and read processes 200 and 220 (FIGS. 9 and 10). The blocks 132 and 134 labeled "DM" represent data multiplexers, which can also be referred to as data mux blocks. The data mux blocks 132 and 134 may be used to select a row in the compute buffer 126 during the writing and reading processes 200 and 220 (FIGS. 9 and 10). Each CBbyte 130 may have one data mux block 132 for a write path, and two data mux blocks 134 for a read path. As depicted in FIG. 5, a row of each CBbyte 130 may be isolated to input data into one ALU 128. As will be discussed, the input of one row of CBbytes 130 for one ALU 128 may allow one operation to be completed on an operand in a single ALU 128, and multiple operations to be processed in parallel by multiple ALUs 128.

The compute buffer 126 may include one or more CBbytes 130, which may refer to a storage unit for each byte of information in the compute buffer 126. For example, the CBbyte 130 may be referred to as a CBbyte block, which may include a row or a chain of flops or latches, or any other suitable memory element. As seen in FIG. 6, each of the 8 flops 152 in the CBbyte 130 may be connected to a write bus line 146 and a read bus line 148, which may enable data to be stored on and read from the CBbyte 130. A sequencer 112 (FIG. 2) may determine where to write or read data on the CBbytes 130 by asserting the write byte select 154 or the read byte select 166 coupled to each CBbyte 130. For example, the sequencer 112 may write data by asserting the write byte select 154 to the appropriate flops 152 in a CBbyte 130, or locate data to be read by asserting the read byte select 156 to the appropriate flops 152 (FIG. 5).

Referring again to FIG. 5, the CBbytes 130 may be arranged in an array, and separated by pass gates 136 and 138. The pass gates 136 and 138 may be enabled or disabled to electrically connect or isolate each CBbyte 130. Each CBbyte 130 may have a write pass gate 136 to connect or isolate CBbytes 130 in the write bus 146 during write operations, and a read pass gate 138 to connect or isolate CBbytes 130 in the read bus 148 during read operations. As depicted in the diagram of FIG. 7, a pass gate block 158 may include pass gates 136 and 138 which connect the path between X[n] and Y[n] when enabled, and isolate the path between X[n] and Y[n] when disabled.

Further, the write and read paths to and from the CBbyte 130 may be controlled by the data mux blocks 132 and 134 (FIG. 5). The data mux blocks 132 and 134 may be used to select a row in the compute buffer 126 to be written or read. As will be discussed, each CBbyte 130 may have one data mux block 132 for a write path, and the write path may be separated by a write pass gate 136. Each CBbyte 130 may also have two data mux blocks 134 for a read path, and the read path may be separated by a read pass gate 138. The diagram of a data mux block 132 or 134 in FIG. 8 depicts the select line 160 which may be used by the sequencer 112 to select the row in which the compute buffer 126 is being written or read. When the sequencer 112 writes data into the compute buffer 126, it may assert the select line 160 on the data mux block 132, and the data may be driven in from the data inputs 150, represented as the B[7:0] wires, to the write bus 146 of the selected row n, represented as the A[7:0] wires. When the sequencer 112 reads data from the compute buffer 126, it may assert the select line 160 on the data mux block 134, such that the data may be driven from the read bus 148, represented by the A[7:0] wires, to the A or B inputs 140 or 142 (there are two read data mux blocks 134 for each CBbyte 130) to the ALUs 128. The outputs read from the compute buffer 126 to the A or B inputs 140 or 142 are represented as the B[7:0] wires.

The ALUs 128 may be part of the compute engine 108 and not a part of the compute buffer 126. ALUs 128 may be connected to the compute buffer 126, such that data may be communicated (e.g., sent, directed, transferred, written, inputting, etc.) between the compute engine 108 and the compute buffer 126. In embodiments, the inputs A and B 140 and 142 may provide two operands A and B to each ALU 128. Further, though not depicted in this diagram, each ALU 128 may also output data to the input mux 144 of a CBbyte 130. For example, the data output from the ALUs 128 may include intermediate results, or final results of executed operations to be stored in the compute buffer 126 before being written to a memory array 106 (FIG. 2).

Data may be input to a compute buffer 126 from the ALUs 128, as discussed, or from the memory array 106 or from the external input/output (I/O) of the memory controller 102. One embodiment of the present techniques includes systems and methods of writing (e.g., inputting) to a compute buffer 126 to improve the performance of a compute engine 108. An example of an input path 200 for the compute buffer 126 is depicted in the flow chart of FIG. 9. A sequencer 112 may start the input process (block 202) by selecting the data to be written to the compute buffer 126 and enabling a data path 150 (FIG. 5) through the input mux 144 (block 204). The sequencer 112 may select the data to be written from five different inputs of the input mux 144, including an external I/O, array A, array B, shift register, and sum register. The arrays A and B may be input from different parts of the memory array 106. In some embodiments, the memory array may include banks A and B, which may be connected to one another, configured around the compute buffer 126, or otherwise configured on the memory device 104. The external I/O may be input from devices external to the memory device 104, which may include, for example, the memory controller 102. Further, as the compute engine 108 may write intermediate results or final results of executed operations to the compute buffer 126 before the information is written to the memory array 106, the shift register and sum register may be output from the ALUs 128 as inputs into the compute buffer 126.

The sequencer 112 may then select a targeted row in the compute buffer 126 on which to write the data (block 206). The sequencer 112 may select the targeted row by driving the select line 160 for the data mux 134 of the targeted row. The input of the write data mux 134 of the targeted row may be set to an active state while the inputs of write data muxes 134 of other rows remain in an inactive state. The data passes from the input mux 144 through the block of write data muxes 134 until reaching the activated write data mux 134 (block 208). Once reaching the target row with the activated write data mux 134, the data may pass through a write bus 146 of the target row. For example, if data from the sum registers was to be written into a row 5 of the compute buffer 126, the sequencer 112 may set the input mux 144 to input the sum register. The input for the data mux for row 5 would be set to an active state while the inputs of all other data muxes in that input line remain inactive. The data would pass through the input line until reaching the write data mux 134 of the targeted row 5, and through the write bus line 146 of row 5.

In one embodiment, the CBbytes 130 on each write bus 146 may be connected or isolated through the enabling or disabling of write pass gates 138 on the write bus 146 (block 210). The sequencer 112 may separate the write bus 146 into a number of subsections, which may be based on the size of the operand to be stored in the compute buffer 126. For example, if an 8 byte operand is to be input into row 5 of the compute buffer 126, the sequencer 112 may disable each write pass gate 138 of the write bus 146 of row 5. When a pass gate 138 is disabled, the CBbytes 130 on either side of the pass gate 138 are electrically isolated. Thus, only one byte (one from each CBbyte 130) may be input into one ALU 128. If a 16 byte operand were to be input into row 5 every other write pass gate 138 of the write bus 146 of row 5 may be enabled. When a pass gate 138 is enabled, the CBbytes 130 on either side of the pass gate 138 is electrically connected, such that 2 CBbytes 130 may be used to store the 16 byte operand. The CBbyte 130 in the target row is selected by asserting the byte select and writing the operand to the target CBbyte(s) 130 (block 212), ending the write process 200 (block 214). The connecting and isolating of subsections in the compute buffer 126 may enable the sequencer 112 and each ALU 108 to process all the data in an operation using the same ALU 128 without adding additional clock cycles to shift data into position. Saving clock cycles in the execution of operations may increase the performance of the compute engines 108.

A read process 220 for reading data from a compute buffer 126 in accordance with one or more of the present techniques may also allow the sequencer 112 and the ALUs 128 to process all the bytes in an operation without adding additional clock cycles. The read process 220 may include read pass gates 136 which operate similarly to the write pass gates 138 in connecting or isolating CBbytes 130 in the compute buffer 126. In one embodiment, the read process 220 may differ from the write process 200 in that the compute buffer 126 may include two read data muxes 132, such that two data locations may be selected to be read as two operands into the ALUs 128. As illustrated in FIG. 10, the read process 220 may start (block 222) when the sequencer 224 determines the location of the data to be processed (block 224). Depending on the size of the data to be read, the sequencer 112 may enable or disable read pass gates (block 226). The sequencer may then select the targeted rows on which the operands are stored by activating the inputs of the read data muxes 132 of the targeted rows (block 228). For example, if the operation to be executed is an addition of two 16 bit operands from row 3 and row 4, such that two ALUs 128, each 8 bits wide, may execute the operation on the 16 bit operands. Further, the sequencer 112 may enable every other read pass gate 136 on rows 3 and 4 and activate the inputs for the read data muxes 132 on each of rows 3 and 4. The data from one of the rows 3 or 4 may be driven into the input A 140 while the data from the other row may be driven into the input B 142 of the read data muxes 132 having active select lines (block 230). The inputs A 140 and B 142 may be inputs of an ALU 128 from the compute buffer 108, and may transfer two operands for the ALU 128 to execute the operation.

Figure 11:
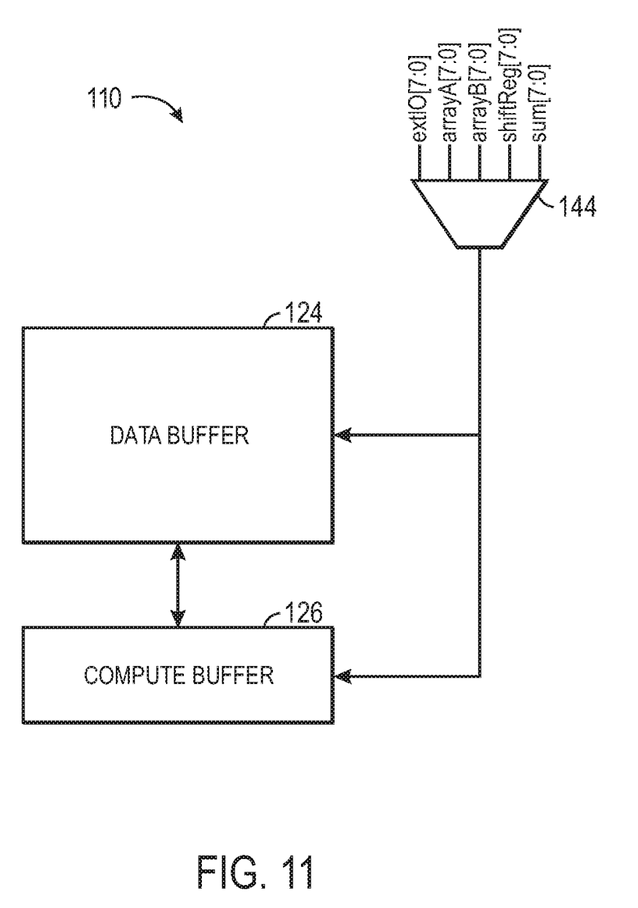
FIG. 11 depicts a block diagram of a data buffer and a compute buffer within a compute engine buffer block, in accordance with one or more embodiments of the present technique.

One or more embodiments of the present techniques can increase the efficiency of a compute engine 108 by enabling efficient storage in the compute buffer 126. One or more of the embodiments may also include a compute buffer 126 having more than one level of buffering. In one embodiment, a data buffer 124 may be added to the compute engine buffer block 110, as illustrated in FIG. 11. The data buffer 124 may be a simple buffer, and may be, for example, latch based or flop based. As the compute buffer 126 is configured to have bytes aligned with the compute engine 108, the configuration of the data buffer 124 may be denser than the compute buffer 126, and may provide enough buffer space to allow for efficient paging operations of the memory array 106. This may increase the density and storage of the compute engine buffer block, providing more storage space for data transfer between the compute engine 108 and the memory array 106 or memory controller 102, which may further improve parallel processing of the compute engine 108.

Figure 12:
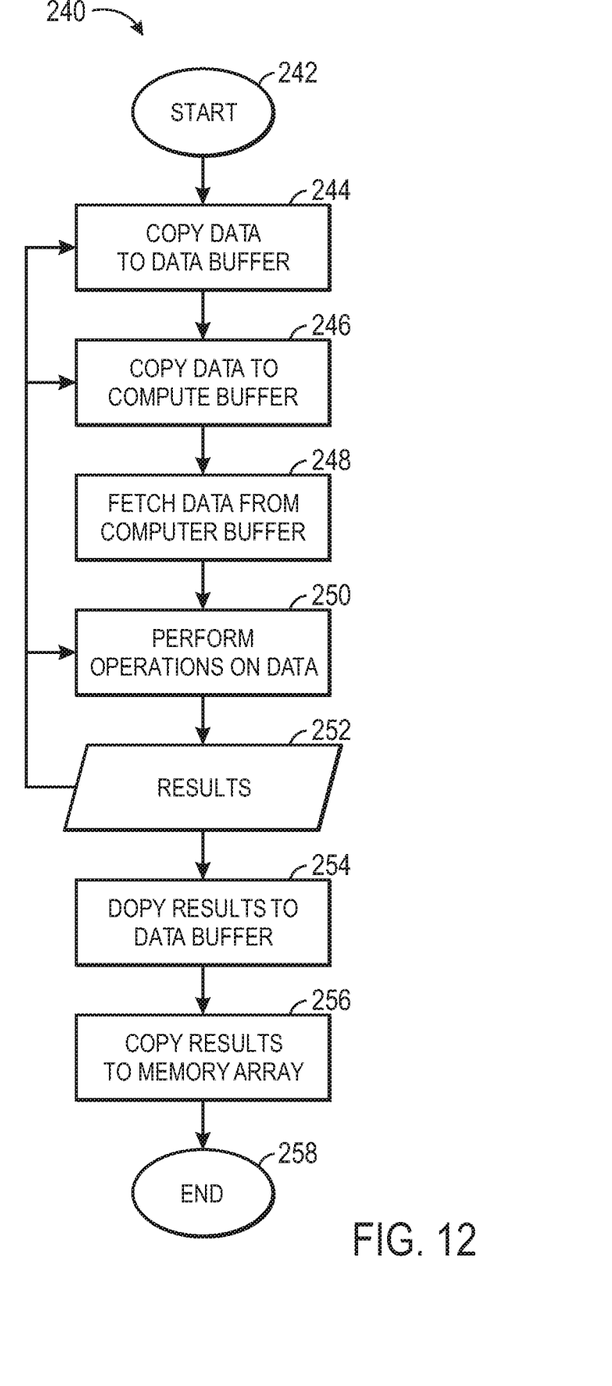
FIG. 12 is a flow chart of a process for copying data to and from a data buffer in a compute engine buffer block, in accordance with one or more embodiments of the present technique.

Access to the memory array 106 may take several clock cycles of the compute engine 108. Thus, in embodiments, clock cycles may be reduced by using a data buffer 124 as well as the compute buffer 126. FIG. 12 presents a flow chart of a process 240 of copying data to and from a data buffer 124 in a compute engine buffer block 110. In one embodiment the process 240 may start (block 242) by storing data to be used by the compute engine 108, into the data buffer 124 (block 244). Data may be copied into the data buffer 124 from the memory array 106, or from an external processor, such as the memory controller 102. A sequencer 112 may control the copying of data to the data buffer 124. Further, data to be used by the compute engine 108 may also be copied into the compute buffer 126 (block 246). In embodiments, data may be copied to the compute buffer 126 from the data buffer 124, or directly from the memory array 106 or the memory controller 102. A sequencer 112 may retrieve the data from the compute buffer 126 and send it to the compute engine 108 (block 248), such that the compute engine 108 may operate on the operands (block 250) to produce results 252 of the operations. In some operations, the results 252 may be intermediate results, and may be used by the compute engine 108 in future cycles of the operation. In some embodiments, the intermediate results 252 may be directed back to the compute engine 108 so that the compute engine 108 may complete the operation (block 250), or the intermediate results 252 may be copied to either the data buffer 124 (block 244) or the compute buffer 126 (block 246).

As discussed, when the operands are copied to the data buffer 124, the sequencer may transfer the operands from the data buffer 124 to the compute buffer 126, rather than from the memory array 106 to the compute buffer 126, saving clock cycles. Typically, accessing the memory array 106 may take approximately 100 ns, and a compute cycle may take approximately 1-5 ns, depending on the implementation of the compute engine 108. Each row copied from the data buffer 124 to the compute buffer 126 may take one cycle, while each row copied from the memory array 106 to the compute buffer 126 may take several cycles. Therefore, depending on the configuration of the compute engine 108 and compute buffer 126, and depending on the size of operands to be copied, an additional buffer, the data buffer 124, may save many clock cycles for the compute engine 108.

Furthermore, the compute engine 108 may also copy final results 252 to the data buffer 124 (block 254). In some embodiments, the final results 252 may eventually be copied from the data buffer 124 to the memory array 106 (block 256), ending the process 240 (block 258). The copying of results 252 to the data buffer 124 rather than the compute buffer 126 may save storage space on the compute buffer 126, and the compute buffer 126 may be reserved for holding data for future operations, such as to improve the efficiency of the compute engine 108. As the compute buffer 126, which is configured to parallel the compute engine 108, may be structurally limited in storage density. Thus, the denser data buffer 124 may provide greater and more efficient storage space for data from completed operations. While a compute buffer 126 may be configured to store data in parallel with a compute engine 108, and may maneuver data to one operation to be completed on one ALU, the compute buffer 126 may be comparatively less dense than the data buffer 124. Thus, one or more of the present techniques of a parallel compute buffer 126 joined with a simple data buffer 124 may further improve compute engine performance without substantial increases in the size of the memory device 104.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory device comprising:
an internal processor configured to process operations on data using portions of the data; and
a buffer comprising:
a compute buffer capable of storing the data in sections, wherein a size of each section matches a size of each portion of data, and wherein the compute buffer is coupled to the internal processor via one or more inputs and one or more outputs; and
a data buffer configured to store the data and results of the operations on the data.

2. The memory device, as set forth in claim 1, wherein the internal processor comprises one or more arithmetic logic units (ALUs), and wherein the size of each section matches a width of each of the one or more ALUs.

3. The memory device, as set forth in claim 1, wherein the one or more ALUs are configured to process the operations on one or more sets of data in parallel.

4. The memory device, as set forth in claim 1, wherein the data stored in the data buffer is transferrable to the compute buffer, and wherein the results of the operations on the data is written to the data buffer from the internal processor.

5. The memory device, as set forth in claim 1, comprising a sequencer configured to transfer the data from the data buffer to the compute buffer and configured to store the results of the operations on the data to the data buffer.

6. The memory device, as set forth in claim 1, comprising a memory array configured to store the data and the results of the operations on the data.

7. The memory device, as set forth in claim 6, comprising a sequencer configured to transfer data and the results of the operations on the data between the memory array and the buffer.

8. The memory device, as set forth in claim 6, comprising a sequencer configured to transfer data and the results of the operations on the data between the memory array, the data buffer, and the compute buffer.

9. The memory device, as set forth in claim 1, wherein the compute buffer comprises:
storage units arranged in an array in the compute buffer; and
pass gates configured to electrically connect or isolate the storage units based on a size of the data to be stored.

10. A method of operating a memory device, comprising:
selecting two data sets to read from a compute buffer of the memory device;
selecting one or more rows in the compute buffer from which the two data sets are to be read;
connecting or isolating storage units based on a size of the two data sets; and
reading the data from at least one storage unit in the one or more selected rows, wherein the memory device comprises an internal processor coupled to the compute buffer and configured to send data to and receive data from the compute buffer.

11. The method, as set forth in claim 10, wherein selecting the two data sets to read from the compute buffer comprises selecting data from one or more of an external input/output, a memory array in the memory device, a shift register, or a sum register.

12. The method, as set forth in claim 10, wherein selecting the one or more rows in the compute buffer comprises activating an input on a multiplexer coupled to the row.

13. The method, as set forth in claim 10, wherein the compute buffer comprises a plurality of storage units, and connecting or isolating the storage units comprises forming some of the plurality of storage units into storage sections.

14. The method, as set forth in claim 10, comprising writing the data to the at least one storage unit.

15. A method of operating a memory device, comprising:
storing data to be used by an internal processor of a memory device to a data buffer on the memory device;
storing the data to sections of a compute buffer on the memory device;
retrieving the data from the compute buffer;
executing one or more operations on portions of the data; and
storing a result of the executed operation in the data buffer and/or the compute buffer, wherein the compute buffer is coupled to the internal processor and configured to send data to and receive data from the internal processor, and a size of each section of the compute buffer matches a size of each portion of the data.

16. The method, as set forth in claim 15, wherein the data buffer is denser than the compute buffer.

17. The method, as set forth in claim 15, comprising transferring the data from the data buffer to the compute buffer.

18. The method, as set forth in claim 15, further comprising transferring the data from the compute buffer to the internal processor.

19. The method, as set forth in claim 18, wherein the internal processor comprises one or more arithmetic logic units.

20. The method, as set forth in claim 15, comprising copying data to one or more of the compute buffer or the data buffer from a processor external to the memory device.

21. The method, as set forth in claim 15, wherein the results are stored only in the data buffer.

22. The method, as set forth in claim 15, wherein the results comprise intermediate results.

23. The method, as set forth in claim 15, wherein the results comprise final results.

24. A memory device comprising:
an internal processor configured to process operations on data using portions of the data; and
a compute buffer comprising:
an array of storage units, wherein a size of each storage unit matches a size of each portion of the data;
a plurality of pass gates configured to electrically connect or isolate one or more of the storage units; and
a plurality of multiplexers configured to enable the selection of one or more of the storage units from the array, wherein the compute buffer is coupled to the internal processor via one or more inputs and one or more outputs.

25. The memory device, as set forth in claim 24, further comprising a data buffer configured to copy data to the compute buffer.

26. The memory device, as set forth in claim 25, wherein the data buffer is configured to receive data from the internal processor.

27. The memory device, as set forth in claim 24, wherein the storage units in the compute buffer stores data accessible to the internal processor.

28. The memory device, as set forth in claim 24, wherein the storage units are configured to be electrically connected or isolated based on a configuration of the internal processor.

29. The memory device, as set forth in claim 24, wherein the compute buffer is configured to store data based on instructions from a sequencer coupled to the compute buffer.

* * * * *